United States Patent [19]

Reeder et al.

[11] 3,716,809

[45] Feb. 13, 1973

[54] ACOUSTIC SURFACE WAVE RESONATOR

[75] Inventors: Thomas M. Reeder, Palo Alto; Richard Smith, Balboa Island, both of Calif.

[73] Assignee: The United States of America as represented by the Secretary of the Air Force

[22] Filed: Aug. 11, 1971

[21] Appl. No.: 170,798

[52] U.S. Cl. ...............333/82 R, 333/30 R, 333/72 R, 310/9.8

[51] Int. Cl. ........H03h 9/04, H03h 9/20, H03h 13/00

[58] Field of Search ......333/82, 30, 72; 310/8.2, 9.8, 310/9.7, 8.0

[56] References Cited

UNITED STATES PATENTS 3,596,211 7/1971 Dias et al. ...............................333/72

3,568,102 3/1971 Tseng .....................................333/30

*Primary Examiner*—Herman Karl Saalbach
*Assistant Examiner*—Marvin Nussbaum
*Attorney*—Harry A. Herbert, Jr. et al.

[57] ABSTRACT

High Q performance is achieved in an acoustic surface wave resonator by the use of acoustic surface wave reflectors. The resonator input transducer and the reflectors are affixed to the propagation surface of a piezoelectric substrate member by photolithographic process. The input transducer is an interdigital structure having many long interleaving finger members. The reflectors also have long interleaving finger members and are positioned in close parallel relationship to the transducer finger members. The reflectors are electrically terminated by inductances.

1 Claim, 2 Drawing Figures

PATENTED FEB 13 1973

3,716,809

INVENTORS
THOMAS M. REEDER
W. RICHARD SMITH
BY Harry A. Herbert Jr. and Willard R. Matthews, Jr.
ATTORNEYS

ACOUSTIC SURFACE WAVE RESONATOR

BACKGROUND OF THE INVENTION

This invention relates to acoustic surface wave and microelectronic devices and in particular to acoustic surface wave resonators and means for achieving high Q operation thereof.

Acoustic volume wave resonators have been in use for some time. These resonators however have an upper frequency limit since the volume excitation device becomes impractically thin for operation above 100 MHz. The size, weight, and power requirement of acoustic volume wave devices have prompted the recent development of acoustic surface wave devices. In addition to overcoming the size, weight and power requirement limitations of acoustic volume wave components, the acoustic surface wave devices utilize microelectronic techniques and can be incorporated into integrated circuits. High Q inductance components have not been achieved by integrated circuit techniques and consequently an effective micro-electronic resonator has not yet been developed. The present invention is directed toward providing both an effective acoustic surface wave resonator and high Q inductance in integrated circuits.

SUMMARY OF THE INVENTION

The present invention comprehends an acoustic surface wave device for use in electronic resonator and filter applications at VHF and UHF frequencies. This device, which falls into the microelectronic class, is fabricated by photolithography on the polished surface of a piezoelectric crystal. Physically, it consists of a number of parallel metal electrodes or comb structures which are interleaved so that voltages of opposite polarity can be applied to adjacent electrodes. With electric excitation acoustic stress waves are generated at the piezoelectric surface which travel symmetrically away from the electrode structure. Similar electrode structures are placed on each side of the center structure to reflect these stress waves back to the center structure, thus forming an acoustic surface wave resonator.

It is a principal object of the invention to provide a new and improved acoustic surface wave resonator.

It is another object of the invention to provide an acoustic surface wave resonator suitable for operation at VHF and UHF frequencies.

It is another object of the invention to provide an acoustic surface wave resonator having a higher Q than currently available microelectronic devices of similar type.

These together with other objects, features and advantages of the invention will become more readily apparent from the following detailed description when taken in conjunction with the illustrative embodiment in the accompanying drawings.

DETAILED DESCRIPTION OF THE PREFERRED EMBODIMENT

Figure 1:
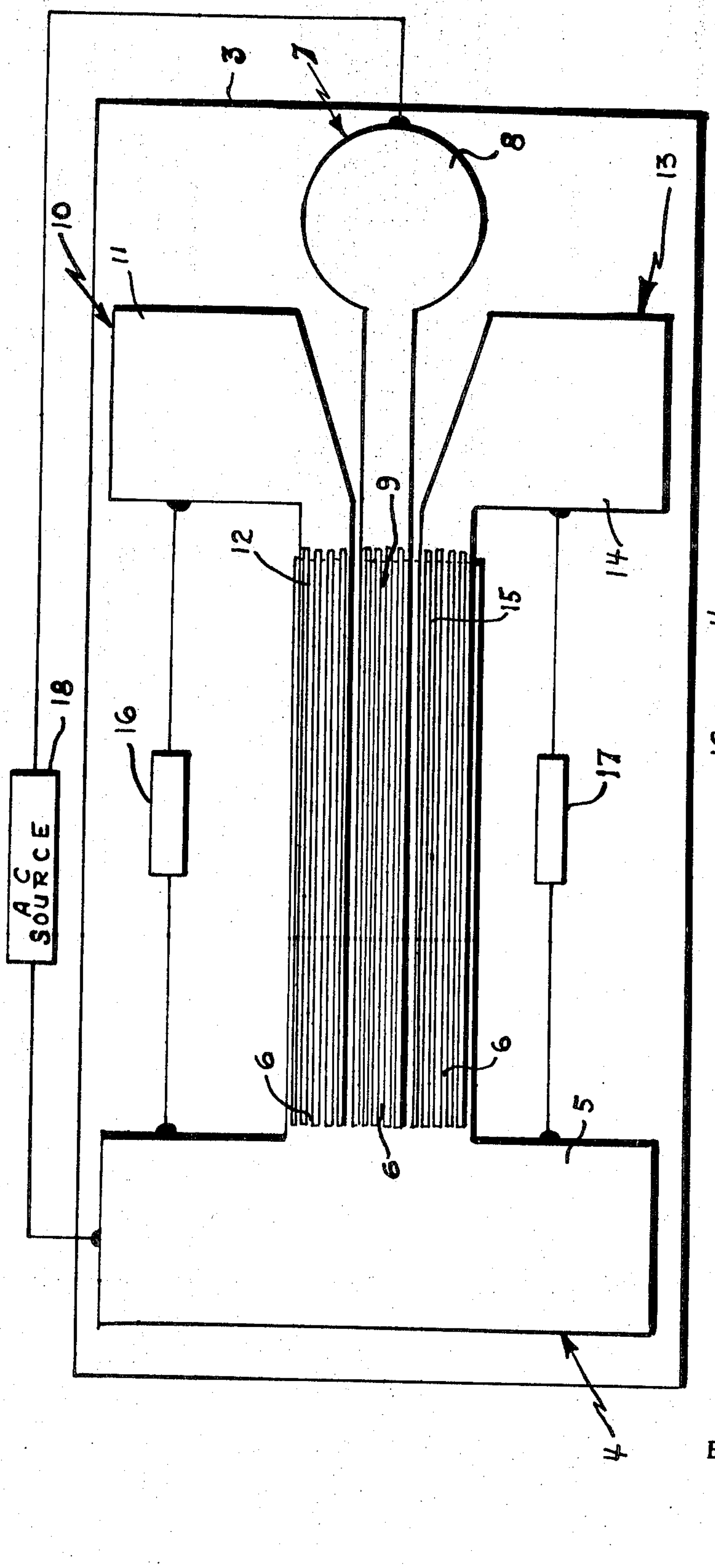
FIG. 1 is a plan view of one presently preferred embodiment of the invention.

The resonator comprehended by the invention consists of a number of interleaved metal electrodes which are deposited by photolithography on the polished surface of a piezoelectric crystal. As shown in FIG. 1, these electrodes are arranged into three parallel sections. When an RF potential from AC source 18 is applied to the center section via terminal pads 5 and 8, acoustic stress waves are symmetrically radiated toward the other two sections. Electric inductors 16 and 17 connected between terminal pads 5–11 and 5–14 respectively provide the proper phase shift so that the stress waves are reflected by the outer sections back toward the center section, thus creating a resonant surface wave pattern. An important feature of the theory for this device is that the electric Q seen at the transducer terminals may be much higher than the $Q_L$ of the inductors. Thus, a Q much higher than presently available with ordinary microcircuit components may be created.

Figure 2:
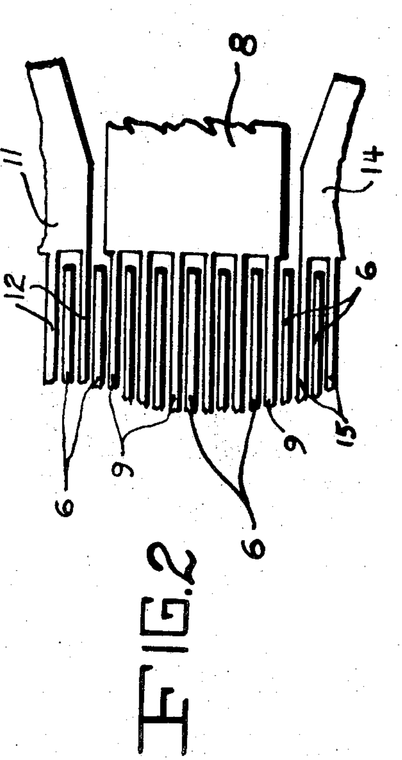
FIG. 2 is an enlarged detail of a portion of the embodiment of FIG. 1 illustrating the interdigital transducer and reflector structures.

FIGS. 1 and 2 illustrate in detail the structure of such a resonator. Substrate member 3 is a piezoelectric material such as lithium niobate which has its top surface polished to establish an acoustic wave propagation surface. The electromagnetic wave to acoustic surface wave transducer comprises electrodes 7 and 4. These electrodes are of conductive material and are affixed to the propagation surface by photolithographic process. Electrode 7 consists of terminal pad 8 and interdigital fingers 9. Electrode 4 consists of terminal pad 5 and interdigital fingers 6. The interdigital fingers 9 of electrode 7 are interleaved with the central portion of interdigital finger 6 as illustrated in detail by FIG. 2. Reflectors 10 and 13 are also of conductive material and are affixed to the propagation surface by photolithographic process. Reflectors 10 and 13 consist of terminal pads 11 and 14 and interdigital fingers 12 and 15. They also are interleaved with interdigital fingers 6 of electrode 4 as shown. Reflectors 10 and 13 are also electrically inductively terminated by means of inductors 16 and 17. The physical dimensions of the electrodes, their spacing and the electrical values of the inductors are design matters to be determined by the desired operating frequency of the resonators and other pertinent parameters.

Because of its micro circuit construction, the acoustic surface wave device herein described may be fabricated for operation from 10 to 2,000 MHz and beyond. Theoretical calculations predict a resonator Q of 3,000 at 200 MHz using lithium niobate crystals. Its novel configuration, small size, and compatibility with other microelectronic components indicate that this device will find application in frequency control, wave filters, and discriminators used in frequency demodulation.

While the invention has been described in one presently preferred embodiment, it is understood that the words which have been used are words of description rather than words of limitation and that changes within the purview of the appended claims may be made without departing from the scope and spirit of the invention in its broader aspects.

What is claimed is:

1. An acoustic surface wave resonator comprising:

a substrate member of piezoelectric material having a propagation surface adapted to permit the propagation of acoustic surface waves therealong, a first electrode disposed on said propagation surface consisting of a terminal pad having a multiplicity of parallel elongated strip members extending therefrom, a second electrode consisting of a terminal pad having a multiplicity of parallel elongated strip members extending therefrom disposed on said propagation surface and having its strip members in interleaves relationship with the centrally disposed portion of the first electrode strip members, a first acoustic surface wave reflector consisting of a terminal pad having a multiplicity of elongated strip members extending therefrom disposed on said propagation surface and having its strip members in interleaved relationship within one outwardly disposed portion of the first electrode strip members, a second acoustic surface wave reflector consisting of a terminal pad having a multiplicity of elongated strip members extending therefrom disposed on said propagation surface and having its strip members in interleaved relationships with the other outwardly disposed portion of the first electrode strip members, first inductance means connected between the first reflector terminal pads; and second inductance means connected between the second reflector terminal pads.

* * * * *